(12) United States Patent
Bai et al.

(10) Patent No.: US 9,019,510 B2
(45) Date of Patent: Apr. 28, 2015

(54) CONTROL METHOD AND APPARATUS FOR POSITIONING A STAGE

(76) Inventors: Mingwu Bai, Blacksburg, VA (US); Ming Chen, Blacksburg, VA (US)

( * ) Notice: Subject to any disclaimer, the term of this patent is extended or adjusted under 35 U.S.C. 154(b) by 244 days.

(21) Appl. No.: 13/173,857

(22) Filed: Jun. 30, 2011

(65) Prior Publication Data

US 2013/0004283 A1  Jan. 3, 2013

(51) Int. Cl.
*G01B 11/14* (2006.01)
*H01J 37/20* (2006.01)

(52) U.S. Cl.
CPC ...................................... *H01J 37/20* (2013.01)

(58) Field of Classification Search
USPC .................. 356/614–615, 619–623
See application file for complete search history.

(56) References Cited

U.S. PATENT DOCUMENTS 5,216,235 A * 6/1993 Lin .............................. 250/201.6

* cited by examiner

*Primary Examiner* — Tri T Ton

(57) ABSTRACT

A plurality of laser positioning units are used to position an X-Y stage. In each laser positioning unit, a mirror constantly reflects laser beam to an optical position sensor, where the mirror is integrally mounted on a rotation unit which is integrally mounted on X-Y stage, where the laser diode is mounted on another rotation unit. Each rotation unit includes a fine rotation stage and a coarse rotation stage. When moving the X-Y stage, fine stages constantly rotate mirror or/and laser to reflect the laser beam onto the optical position sensor, the amount of rotations and geometry of position of laser and mirror gives precisely the position of moving stage. The fine stages and coarse stages in different laser positioning units work alternatively to position the stage, and the fine stages are calibrated if coarse stages moves.

1 Claim, 18 Drawing Sheets

CONTROL METHOD AND APPARATUS FOR POSITIONING A STAGE

RELATED APPLICATIONS

No.

RELATED PATENTS

| 2,691,887 | October 1954 | Rinker |
| --- | --- | --- |
| 4,012,112 | March 1977 | Masterson |
| 4,724,318 A | February 1988 | Binnig |
| 5,027,132 | June 1991 | Manns et al |
| 5,051,594 | September 1991 | Tsuda et al |
| 5,114,234 | May 1992 | Otsuka et al |
| 5,323,012 | January 1994 | Auslander et al |
| 5,552,888 | March 1996 | Sogard et al |
| 5,548,195 | August 1996 | Doran |
| 5,663,622 | September 1997 | Sekiguchi |
| 5,705,741 | January 1998 | Eaton et al |
| 5,896,032 | April 1999 | Yagi et al |
| 6,028,305 | February 2000 | Minne et al |
| 6,267,005 B1 | July 2001 | Samsavar et al |
| 6,437,864 B1 | August 2002 | Watanabe et al |
| 6,520,005 B2 | February 2003 | McWaid et al |
| 6,584,367 B1 | June 2003 | Makino et al |
| 6,640,459 B1 | November 2003 | Lucas et al |
| 6,912,054 B2 | June 2005 | Hill |
| 7,792,338 B2 | July 2010 | Bacuset al |

FIELD OF THE INVENTION

This invention pertains to position and control the movement of XY-stage for position measuring, beam centering, guidance system, machine tool alignment, precision machining, and more particularly to control position with very high precision and with large range. This invention also relates to positioning surface in z-direction by a diamond stylus with controlled contact force.

BACKGROUND OF THE INVENTION

X-Y linear stage consists of a platform that moves in X direction and in Y direction relative to a base which is in stationary. The platform and base are joined by two guides that restrict motion of the platform to either x-axis direction or y-axis direction. The motor-driven stages travel ranges of a few millimeters to a few hundreds millimeters. X-Y stages use a guiding system such as crossed roller bearings to move the stage smoothly, however, due to frictional forces generated from moving, thickness variation of very thin lubricant films in the bearings, and minor mechanical gap between guides and rails, there is an inevitable moving errors after any movement, typically in the sub micrometer or micrometer range. The moving errors include errors in the linear motion in x-axis direction, linear motion in y-axis direction which is perpendicular to x-axis, linear motion in z-axis which is perpendicular to x-axis and y-axis, angular motion around x-axis (roll), angular motion around y-axis (pitch), and angular motion around z-axis (yaw). Optical linear encoder system can increase the positioning accuracy. A laser interferometer system can also significantly increase the positioning accuracy of an X-Y stage. To meet increasing demands for the extremely accurate positioning in semiconductor industry and in precision machining industry, present invention provides a new stage positioning control method and apparatus which with very higher precision.

SUMMARY OF THE INVENTION

According to an aspect of the present invention, the position of a platform that moves in X direction relative to a stationary base can be measured by the geometrical relationships among the positions of a laser diode, reflective mirror, and optical position sensor. The laser diode and the reflective mirror can be controlled to rotate with very high precision, so that a laser beam can be constantly reflected to the optical position sensor. According to another aspect of the present invention, the moving error of rotation around x-axis, namely the amount of rolling, can be measured by the position of laser beam on the optical position sensor. Similarly, the position of a platform that moves in y-axis direction relative to the base can also be measured by the same principles. Also, the pitching error can also be measured from the position of laser beam on the optical position sensor. Therefore the positioning of X-Y stage can be positioned and controlled. Another aspect of present invention is a method and apparatus to position the surface by a stylus tip. The position of stylus tip can be precisely measured when it touches a surface of sample by rotating a fine rotation stage to raise or lower the stylus which is integrally attached on an open end of a spring cantilever, the preset space between a capacitive sensor and a film capacitive sensor decides the contact force of stylus tip on the surface, and is measured by the capacitance in the gap.

DESCRIPTION OF PREFERRED EMBODIMENTS

Although the present, invention can be made in many different forms, the presently preferred embodiments are described in this disclosure and shown in the attached drawings. This disclosure exemplifies the principles of the present invention and does not limit the broad aspects of the invention only to the illustrated embodiments.

Figure 1A:
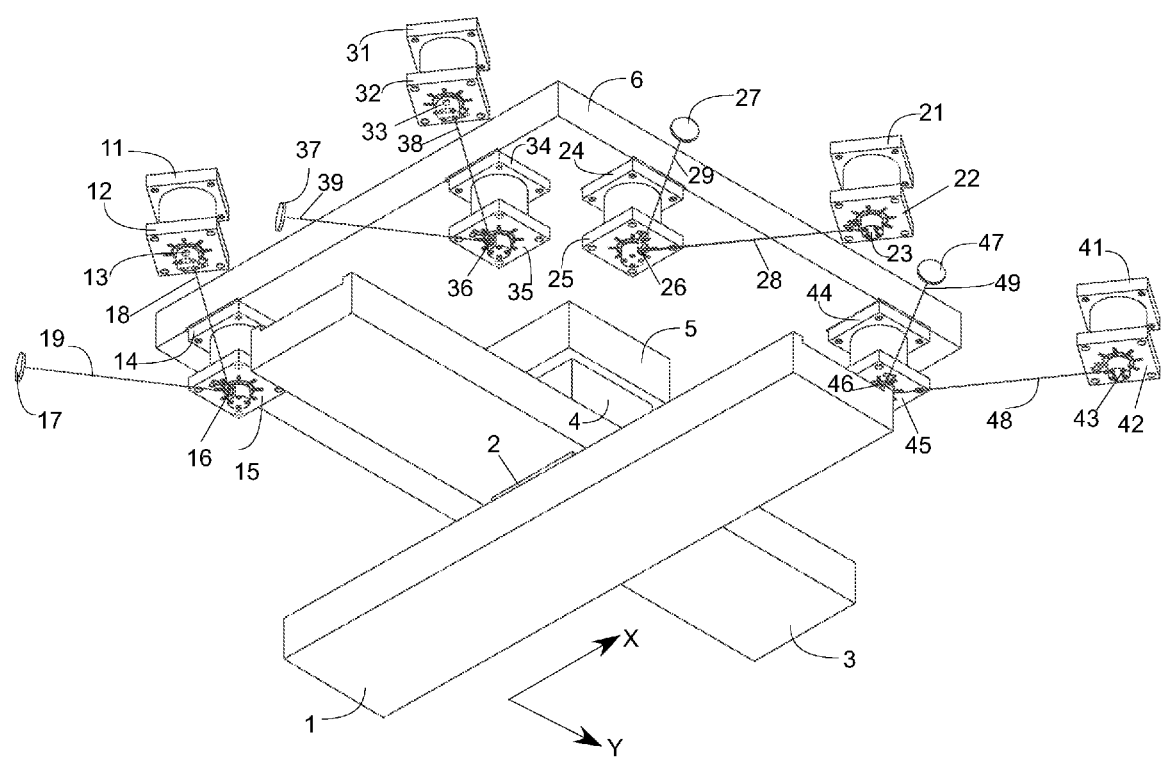
FIG. 1a is a schematic perspective view of XY stage with two laser positioning units in X-direction and two laser positioning units in Y-direction.
Figure 1B:
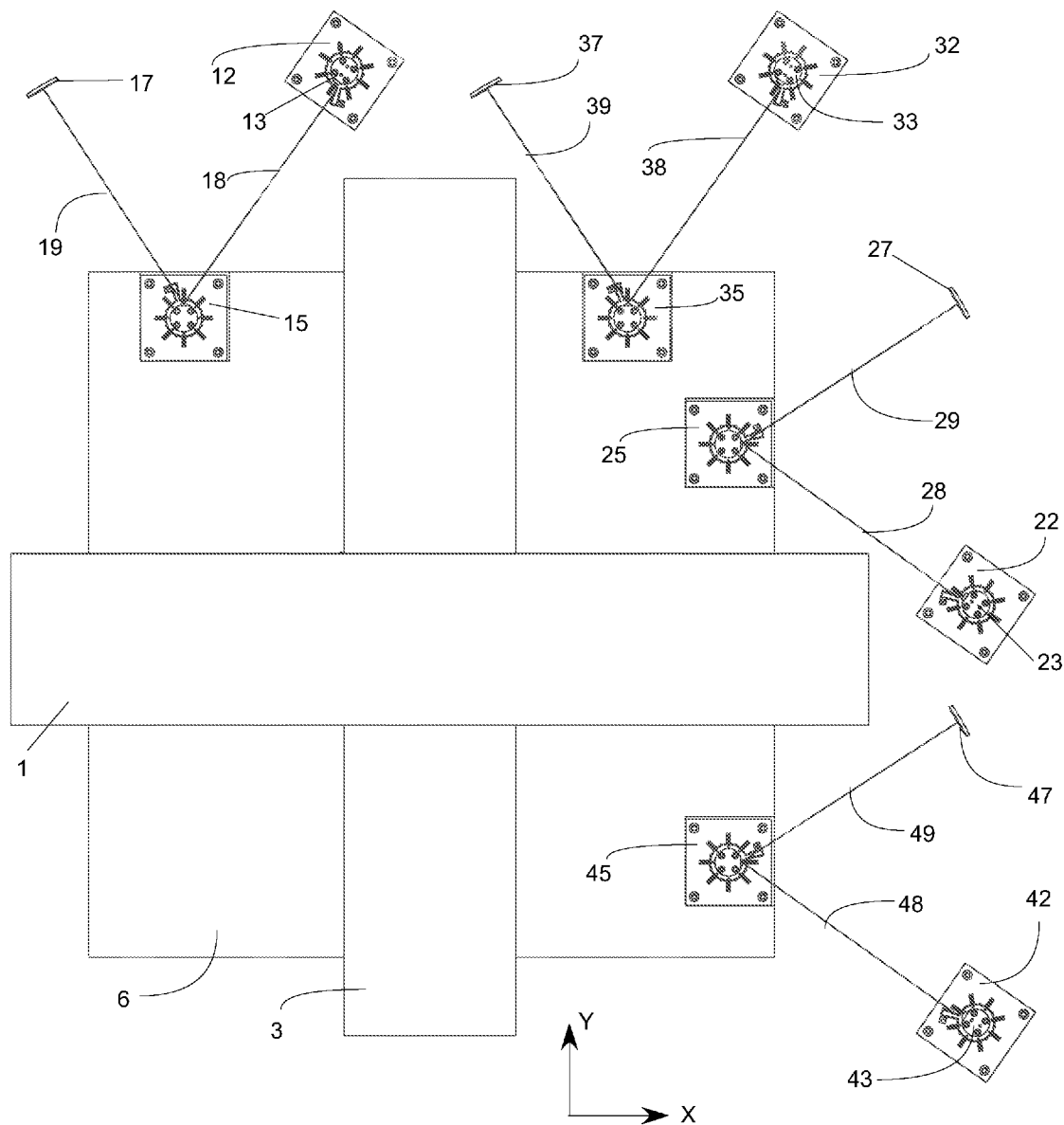
FIG. 1b is a schematic bottom view of XY stage with two laser positioning units in X-direction and two laser positioning units in Y-direction.
Figure 1C:
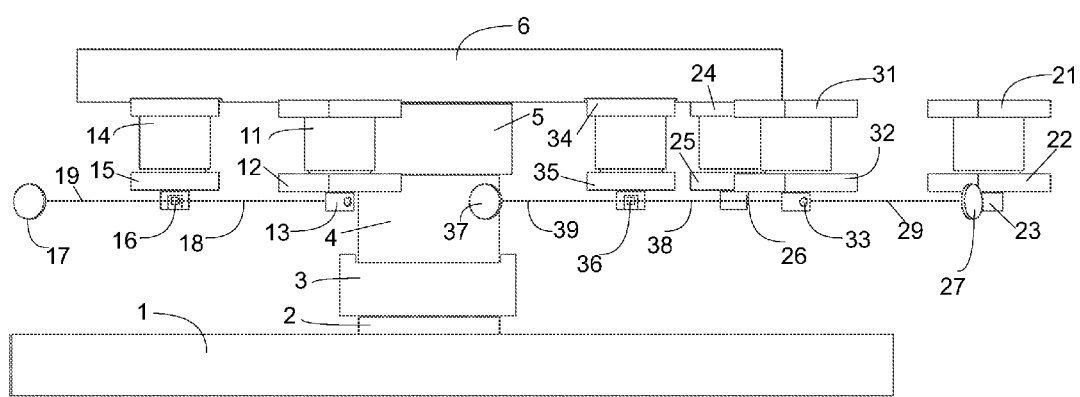
FIG. 1c is a schematic front view of XY stage with two laser positioning units in X-direction and two laser positioning units in Y-direction.

FIG. 1a illustrates a general simplified schematic perspective view of XY stage with four laser positioning units according to one embodiment of the invention. An x-axis stage 1 is rigidly attached on an unshown base which is stationary. The x-axis stage 1 controls a guide 2 to move in x-axis direction only. A y-axis stage 3 is rigidly mounted on the guide 2, the stage 3 controls a guide 4 to move in y-axis direction only. FIG. 1b is a bottom view of simplified schematic XY stage with four laser positioning units. The x-axis stage 1 is orthogonal to the y-axis stage 3. FIG. 1c is a front view of simplified schematic XY stage with four laser positioning units. Stage 1 provides movement in x-axis direction, and stage 3 provides movement in y-axis direction, both in a range from several millimeters to thousands of millimeters with resolution of sub micron to several microns. A tilt stage 5 is rigidly attached to the guide 4, and a platform 6 is rigidly attached to the tilt stage 5. With a combined movement of guide 2 in x-axis direction and guide 4 in y-axis direction, the platform 6 can be moved in both x-axis and y-axis directions. The tilt stage 5 is piezoelectric stacks actuated multi-axis positioner which provides one axis to six axis movement, namely linear movements in X, Y, and Z direction respectively, and rotation movements around X, Y and Z axis. The linear movement has a range of from several micron to tens or hundreds micron with resolution of from sub nanometer to tens nanometer. The tilt stage 5 can be commercial available from Physik Instrumente (PI) GmbH, Germany.

In the FIG. 1a, there are four laser positioning units. For the first laser positioning unit, fine rotation stages 12 is rigidly attached to coarse rotation stages 11, and fine rotation stages 15 is rigidly attached to coarse rotation stages 14. For the purpose of schematic illustration in FIG. 2a, a fine rotation stage is a linear rotator with unique flexure hinges. With piezoelectric actuation, it provides high degree of repeatability and rotation resolution due to the frictionless hinge. The range of rotation can be tens or hundreds of mrad, with resolution to several nrad (nano-rad). For the purpose of illustration in FIG. 2b, a coarse rotation stage is a conventional linear rotator with large rotation range (from sub rad to several rad, or from several degrees to tens or hundreds degree) but low resolution (from sub mrad to hundred mrad). Usually a motor (not shown) such as precision stepper motor or servo motor is used to drive the conventional linear rotator. Still seen in FIG. 1a, FIG. 1b and FIG. 1c, for the first laser positioning unit, the laser diode 13 is rigidly mounted on a fine rotation stage 12 which is integrally mounted on a coarse stage 11, and the coarse stage 11 is rigidly mounted on a stationary unshown base. Therefore the laser diode 13 can be rotated by the fine rotation stage 12 or/and coarse rotation stage 11 relative to stationary base. Similarly, a mirror 16 is integrally mounted a fine rotation stage 15 which is integrally mounted on a coarse stage 14, and the coarse stage 14 is rigidly mounted on platform 6. Therefore the physical position of mirror 16 represents the physical position of platform 6. Similarly, the mirror 16 can be rotated by the fine rotation stage 15 or/and coarse rotation stage 14 relative to stationary base.

A laser diode 13 emits a laser beam 18 onto the mirror 16, the mirror 16 reflects the laser beam 18, and the reflected laser beam 19 can be detected and positioned by an optical position sensor 17. The optical position sensor 17 and coarse rotation stage 11 are rigidly mounted to a stationary unshown base respectively. Similarly, a second laser diode 33 emits laser to a second optical position sensor 37 by the second mirror 36. Therefore, for the movement in x-axis direction, the movement can be positioned by the optical position sensor 17 and optical position sensor 37.

During operation, when the platform 6 moves in x-axis direction, the first laser diode 13 and the first mirror 16 will be controlled to rotate by the rotation of fine rotation stages 12 and 15 to guarantee the laser beam can be captured constantly by the first optical position sensor 17. The moving distance can be precisely calculated by the rotation of fine rotation stages 12 and 15, a detailed calculation method will be disclosed in other part of this patent.

When the fine rotation stages 12 or/and 15 go near their range limit, or if that accumulation of rotations of the fine rotation stage is greater than one rotation or several rotations of the coarse rotation stage, there are two cases to follow, depending on whether the moving of stage can be temporarily stopped or not.

In the first case, if platform 6 is always moving, in other words, we can not stop platform 6 temporarily, two laser positioning units will be used to position the moving platform 6 when it slides in x-axis direction. Before the fine rotation stages 12 or/and 15 reach their moving limits (full range), the second coarse rotators 31 and 34 will rotate based on known values of rotation of fine rotation stages 12 and 15 to guarantee the laser beam 38 be detected by the second optical position sensor 37 by minor rotation of fine rotation stages 32 and 35, in this case, the fine rotation stages 32 and 35 are ready to work (from beginning positions) before the fine rotation stages 12 and 15 reach their moving limits. Therefore, when the fine rotation stages 12 and 15 reach their moving limits, the fine rotation stages 32 and 35 will work to position the moving platform 6 in x-axis direction. With the same principle, before the fine rotation stages 32 or/and 35 reach their moving limits, the fine rotation stages 12 and 15 will work to position the moving the x-axis platform. Finally, the moving platform 6 in x-axis direction can be positioned continuously in a wide range with high resolutions. In the same principle, the mirrors 16 and 36 are positioned to rotate by the rotations of fine rotation stages 12 and 32. Similarly, the platform 6 moving in y-axis direction can be positioned by another two laser positioning units which include optical position sensor 27 and optical position sensor 47.

As an alternative embodiment, for positioning platform 6 which is moving in x-axis direction continuously, the fine rotation stages 12, 15, 32 and 35 can work at the same time on the condition that, the fine rotation stages 32 and 35 begins from starting position of full range while the fine rotation stages 12 and 15 begins from middle position of full range. When either the fine rotation stage 12 or 15 reaches its full range, it will be controlled to move back to starting position of range by the rotation of coarse rotation stages 11 and 14, while the fine rotation stages 32 and 35 is near their middle ranges at this moment, so the fine rotation stages 32 and 35 will be used to position the stage. Similarly, when either the fine rotation stage 32 or 35 reaches its full range, it will be controlled to move back to starting position of range by the rotation of coarse rotation stages 31 and 34, while the fine rotation stages 12 and 15 is near their middle ranges at this moment, so the fine rotation stages 12 and 15 will be used to position the stage. Because optical sensors 17 and 37 constantly capture the lasers emitted from laser diodes 13 and 33 respectively, the platform 6 can be positioned continuously.

A benefit of such method is that the platform 6 can be positioned at two different positions by two laser positioning units at the same time in most of time, except when the fine rotation stages 12 or/and 15, or 32 or/and 35 reaches its moving limit and needed be moving back to beginning position. Also importantly, two laser positioning units give the position of the platform 6 at the same time in most of time, if the positions from two laser positioning units are different, it will be used to calculate the moving deflection in x-axis direction, and the calculation be feedback to tilt stage 5 to counteract the moving error for the platform 6.

Similarly, the movement of platform 6 in y-axis direction can be positioned by other two laser positioning units that include optical position sensors 27 and 47. In other words, the same thing applies to the y-axis direction, and the description thereof is omitted for simplicity. Finally, the platform 6, which is moving in both x-axis direction and y-axis direction, can be positioned continuously by four laser positioning units.

Figure 3:
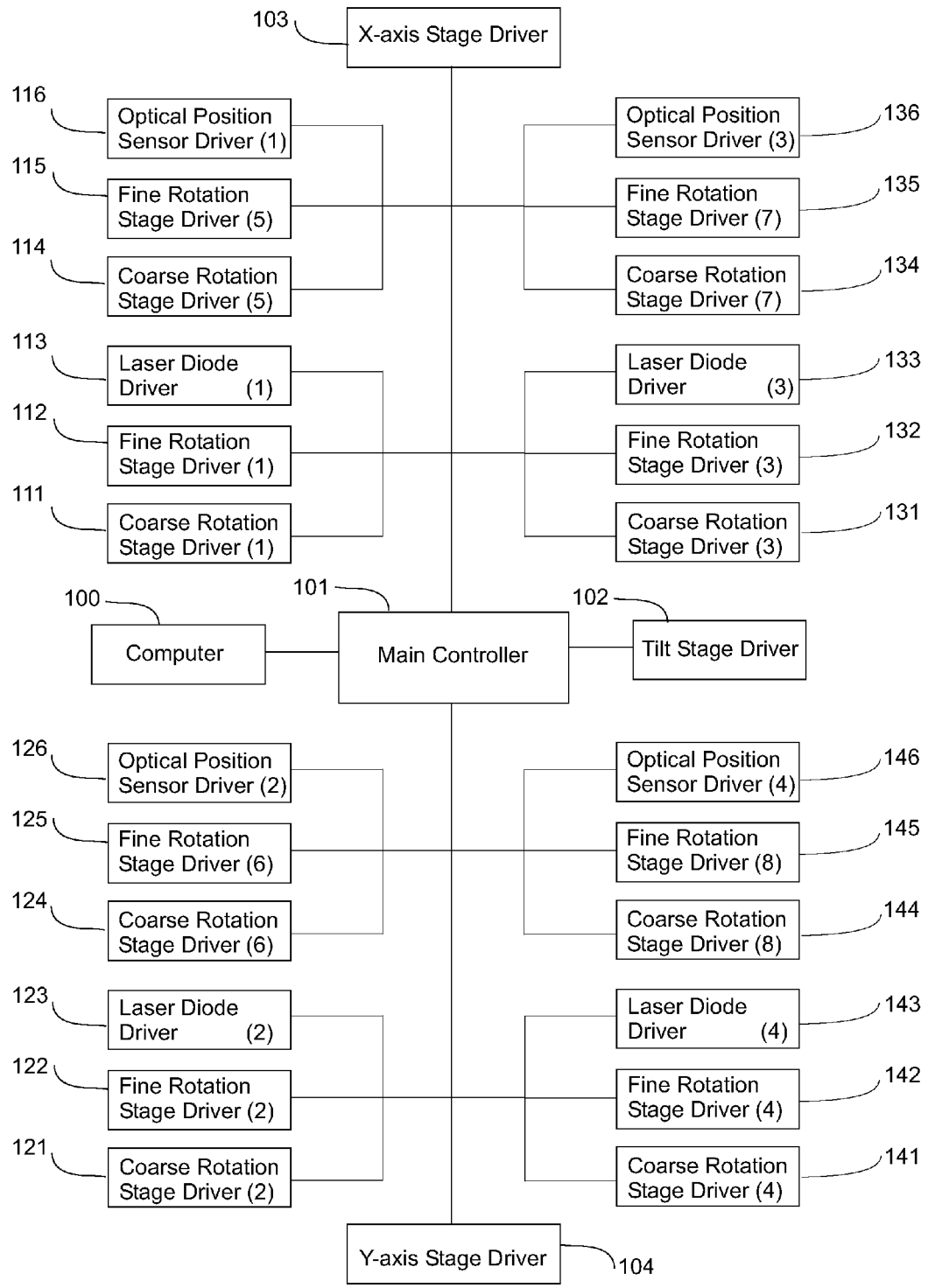
FIG. 3 is a block diagram of an X-Y stage control unit to illustrate the preferred embodiment of the invention.

FIG. 3 schematically shows the block diagram of control method of laser positioning units. A computer 100 sends commands and gets feedback from a main controller 101, and the main controller 101 controls tilt stage driver 102, x-axis stage driver 103, y-axis stage driver 104, and four laser positioning units that numbered by from 111 to 116, by from 121 to 126, by from 131 to 136, and by from 141 to 146. Each laser positioning unit has six drivers or devices, for example, the first laser positioning unit includes a coarse rotation stage driver 111, a fine rotation stage driver 112, a laser diode driver 113, a second coarse rotation stage driver 114, a second fine rotation stage driver 115, and an optical position sensor driver 116.

As a further embodiment, the XY stage can be a supersonic motor driven stage, but the platform 6 can still be positioned by the laser positioning units.

Figure 4A:
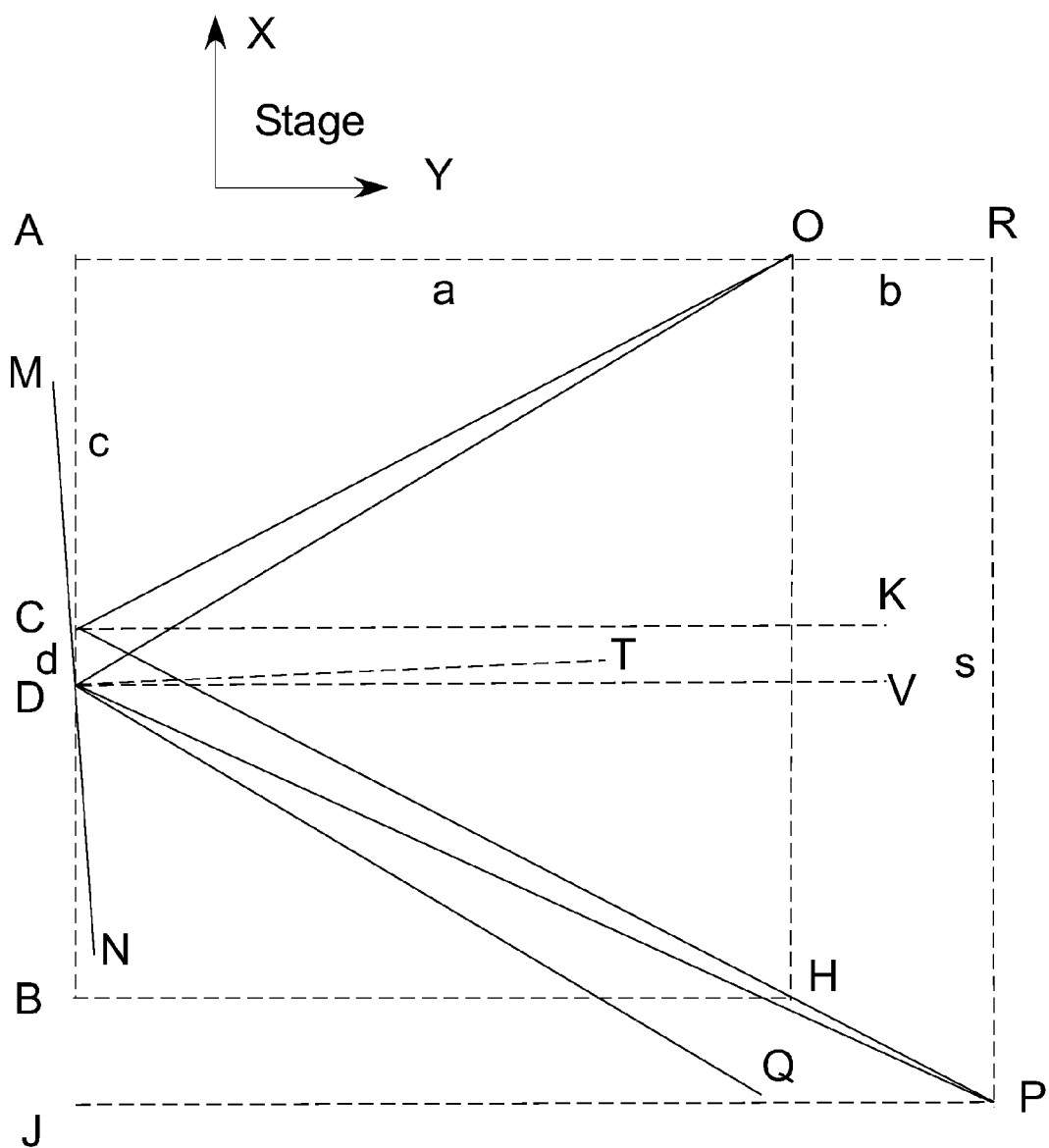
FIG. 4a is a schematic diagram to show the geometrical relationship among laser diode at position O, reflective mirror position at position C (before movement) or position D (after movement). MN is a rotation of mirror at position D. The platform moves from position C to position D along x-axis direction.

There are several different methods for the calculation of the position of platform 6. For the purpose of illustration in FIG. 4a, when a laser emits beam from position O to a mirror at position C (the position of platform 6), the laser beam will be reflected to optical position sensor at position P with $\angle OCK$ equals to $\phi KCP$, where CK is perpendicular to line AB which is in parallel with x-axis. When the mirror on platform 6 moves from position C to position D, the laser at position O rotates and emits beam to mirror at position D, and the laser beam will be reflected to position Q because $\angle ODA$ equals to $\angle BDQ$. However, if the mirror at position D rotates to MN, and TD perpendicular to MN, the laser beam will still reflected to the optical position sensor at position P, where $\angle ODT$ equals to $\angle TDP$. This schematic diagram shows that, when the mirror (platform 6) moves, the rotation of both laser diode and mirror will reflect the laser beam to the optical position sensor.

Because the laser diode and the optical position sensor are fixed, so the distance between position O and position A (OA=a), the distance between position P and position B (PJ=a+b), the distance between position A and position C (AC=c) and the distance between position O and position P (RP=s) are known, when the mirror on the platform moves from position C to position D (CD=d), the moving distance d can be calculated from above known parameters, the rotation angle of laser at position O ($\angle COD=\alpha$) and the rotation angle of mirror at position D ($\angle MDA=\beta$) are known (from fine rotation stage driver), we have $$\angle AOC = \arctan(c/a) \tag{1a}$$

$$\angle AOD = \arctan((c+d)/a) \tag{1b}$$

$$\text{Because } \alpha = \angle AOD - \angle AOC \tag{2}$$

Substituting equations (1a) and (1b) into equation (2) yields equation (3)

$$\alpha = \arctan((c+d)/a) - \arctan(c/a) \tag{3}$$

$$\text{Because } \angle BDP = \arctan((a+b)/(s-c-d)) \tag{4}$$

$$\angle BDP = \beta + \angle NDP = +\angle MDO = \beta + \beta + \angle ADO = 2\beta + \arctan(a/(c+d)) \tag{5}$$

Substituting equations (4) into equation (5) yields equation (6)

$$\beta = [\arctan((a+b)/(s-c-d)) - \arctan(a/(c+d))]/2 \tag{6}$$

Finally, from two equations (3) and (6), we can obtain the unknown d and c by a iterative calculation method. Therefore the moving distance d and the distance of mirror (platform) can be obtained based on the rotations of two fine rotation stages and the physical distance of laser diode, mirror, and optical position sensor. A quick solution can be obtained from equation 3 or equation 6 when the initial position (a, c) is known.

Figure 4B:
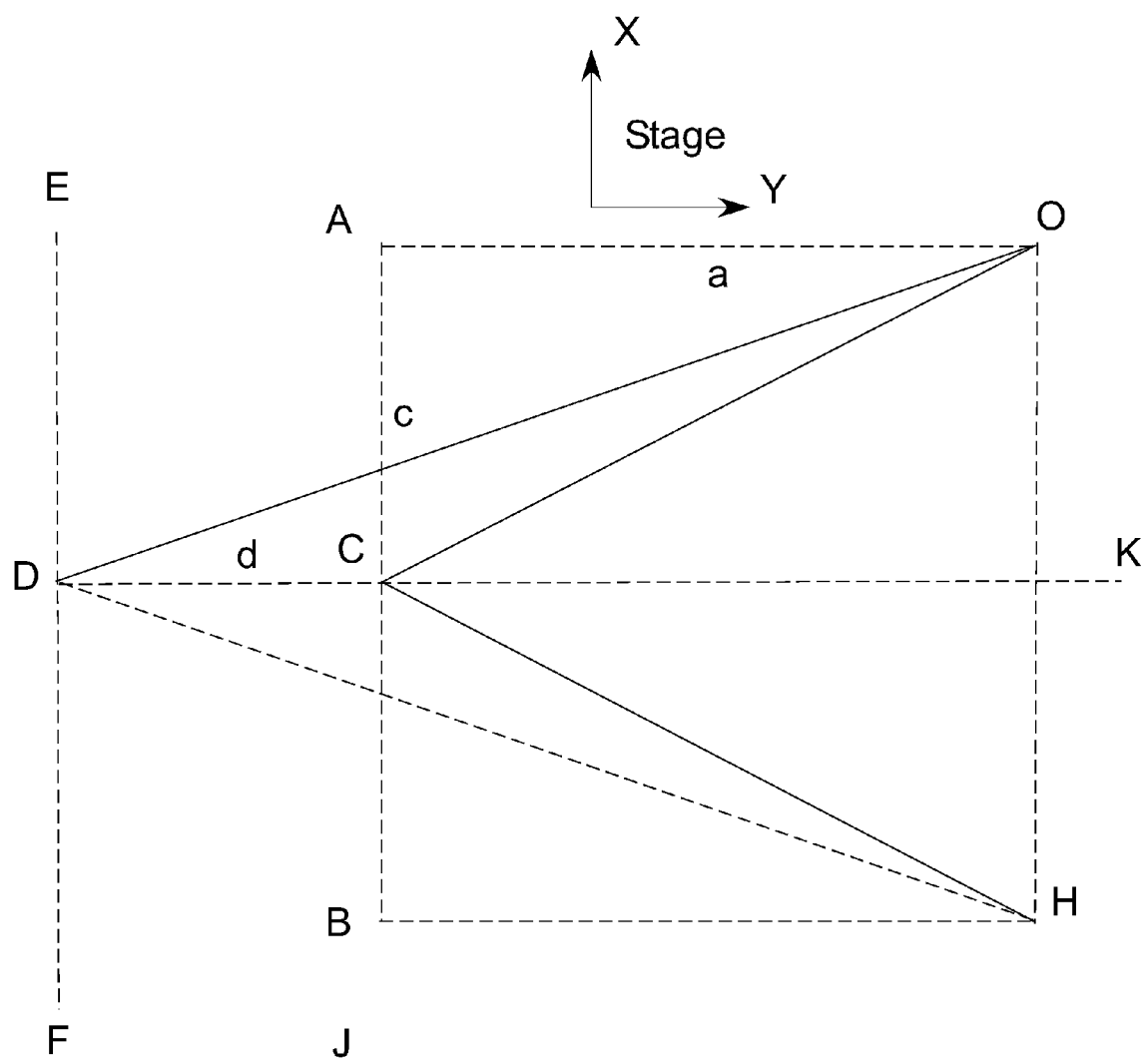
FIG. 4b is a schematic diagram to show the geometrical relationship among laser diode at position O, reflective mirror position at position C (before movement) or position D (after movement). The platform moves from position C to position D along y-axis direction.

As shown in FIG. 4b for the purpose of illustration, for positioning the movement of X stage in a relative displacement in y-axis direction, the moving of stage can be positioned in another way. As shown schematically in FIG. 4b, when the mirror at position C moved to position D, the laser diode rotates an angle of α. If the mirror is at position H which is symmetry to the position O relative to line CK, $$\angle COK = \arctan(a/c) \tag{7}$$

$$\angle DOK = \alpha + \angle COK = \alpha + \arctan(a/c) = \arctan((a+d)/c) \tag{8}$$

Substituting equations (7) into equation (8) yields equation (9)

$$\alpha = \arctan((a+d)/c) - \arctan(a/c) \tag{9}$$

so the moving distance d can be calculated from above equations.

Figure 4C:
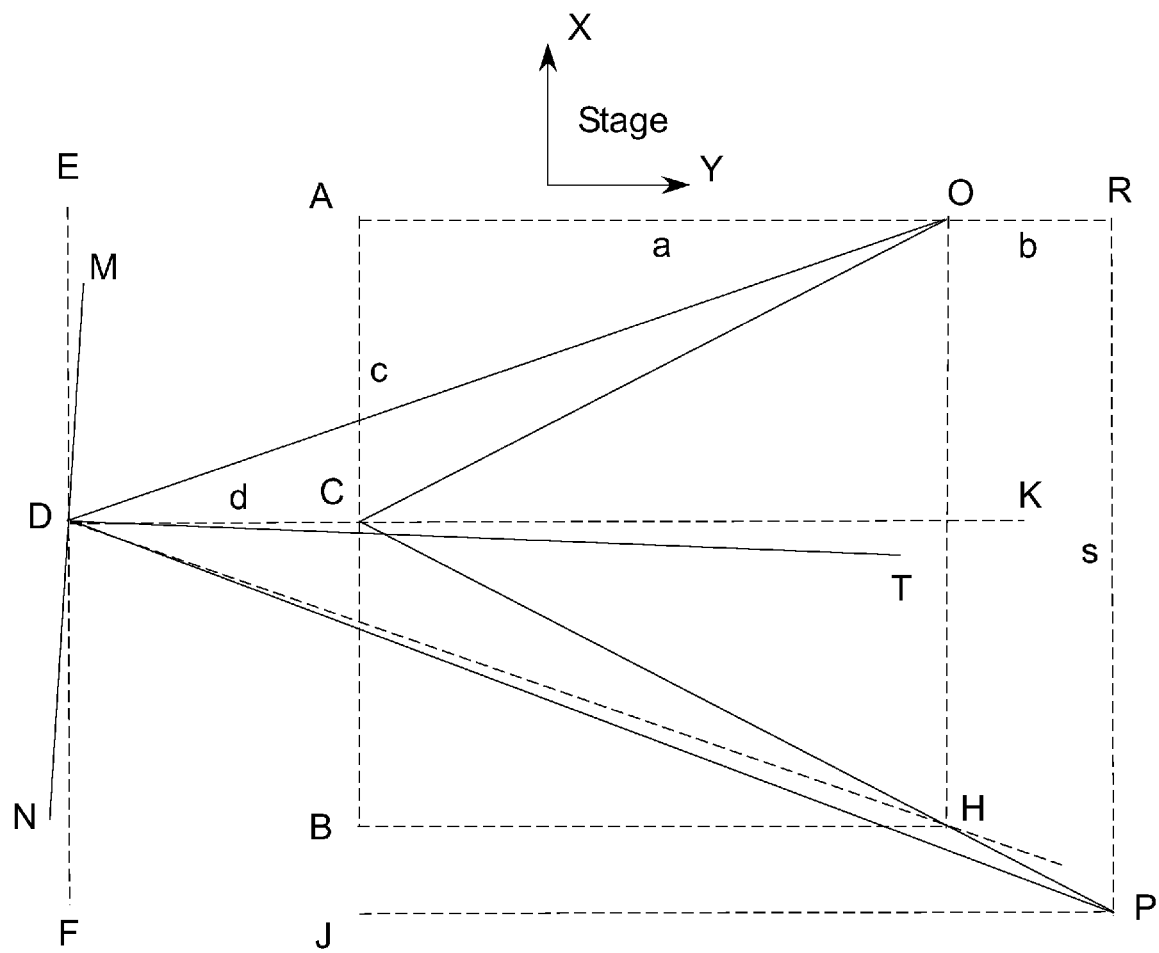
FIG. 4c is a schematic diagram to show the geometrical relationship among laser diode at position O, reflective mirror position at position C (before movement) or position D (after movement). MN is a rotation of mirror at position D. The platform moves from position C to position D along y-axis direction.
Figure 4D:
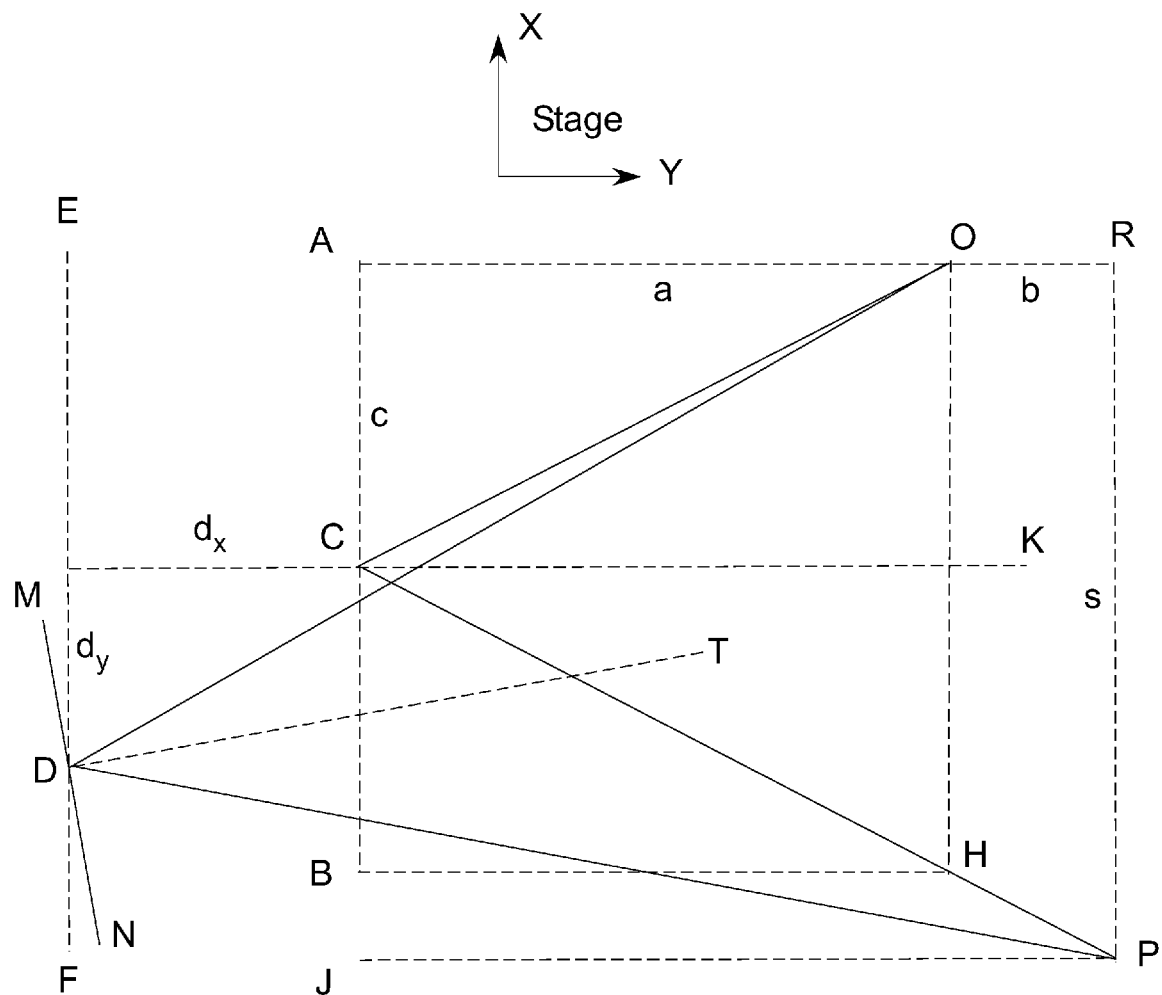
FIG. 4d is a schematic diagram to show the geometrical relationship among laser diode at position O, reflective mirror position at position C (before movement) or position D (after movement). MN is a rotation of mirror at position D. The platform moves from position C to position D that it moves in both x-axis direction and y-axis direction.

As shown in FIG. 4c for the purpose of illustration, if the optical position sensor is at the position P (not H, H is symmetry to O relative to the line CK), the distance d can be solved as a special condition ($d_y=0$) in FIG. 4d as detailed hereafter.

For an XY stage, the platform 6 moves both in x-axis direction ($d_x$) and in y-axis direction ($d_y$). FIG. 4d is a schematic diagram for calculation the moving distance when the laser rotates angle of α at position O, and the mirror rotates angle of β at position D. There are many methods to obtain the values of $d_x$ and $d_y$ based on the geometry, one method is shown as follow ($d_x$ and $d_y$ are represented by x and y hereafter for simplicity):

$$\angle PDN = \angle ODE = \beta + \angle ODE = \beta + \arctan((a+x)/(c+y)) \quad (10)$$

$$\angle PDF = \beta + \angle PDN = \beta + \beta + \arctan((a+x)/(c+y)) = \arctan((x+a+b)/(s-c-y)) \quad (11)$$

$$2\beta + \arctan((a+x)/(c+y)) = \arctan((x+a+b)/(s-c-y)) \quad (12)$$

Because α=∠COD=∠AOD−∠AOC, therefore $$\alpha = \arctan((c+y)/(x+a)) - \arctan(c/a) \quad (13)$$

Actually the amount of c is known because the initial position (a, ∠AOC) of laser at position O and the initial position of mirror at C is known. From two equations (12) and (13), two unknown x and y (values of $d_x$ and $d_y$) can be iteratively solved. Hence the values of x and y can be obtained by solving above two equations. Therefore the mirror at position D can be precisely calculated based on the rotation of laser diode and mirror.

Figure 5:
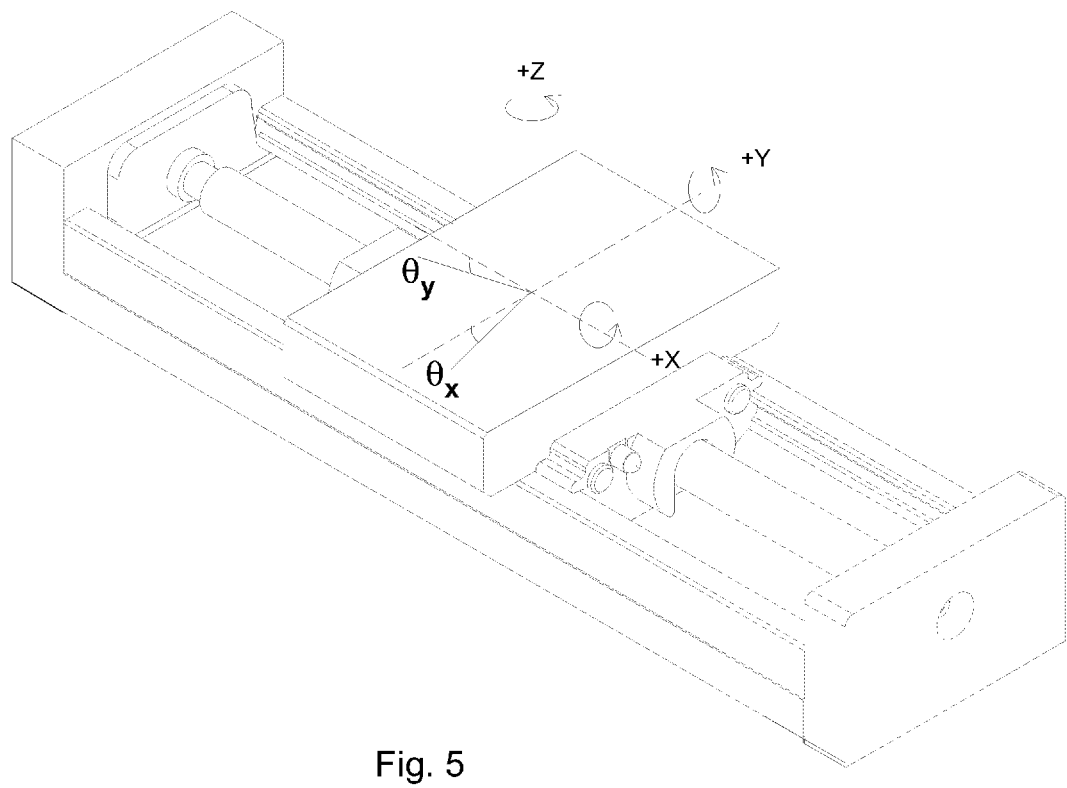
FIG. 5 is a schematic diagram of moving inaccuracy of platform of an X-stage in X-direction, Y-direction, Z-direction, and rotation of platform around X-axis (pitch), Y-axis (roll), and Z-axis (yaw).

FIG. 5 shows schematically the variations of position after movement of stage. During moving of platform in an XY stage, there are very small position errors in the linear motion in x-axis direction (Δx), linear motion in y-axis direction which is perpendicular to x-axis (Δy), linear motion in z-axis which is perpendicular to x-axis and y-axis (Δz), angular motion around x-axis (roll, $\theta_x$), angular motion around y-axis (pitch, $\theta_y$), and angular motion around z-axis (yaw, $\theta_z$).

Figure 6A:
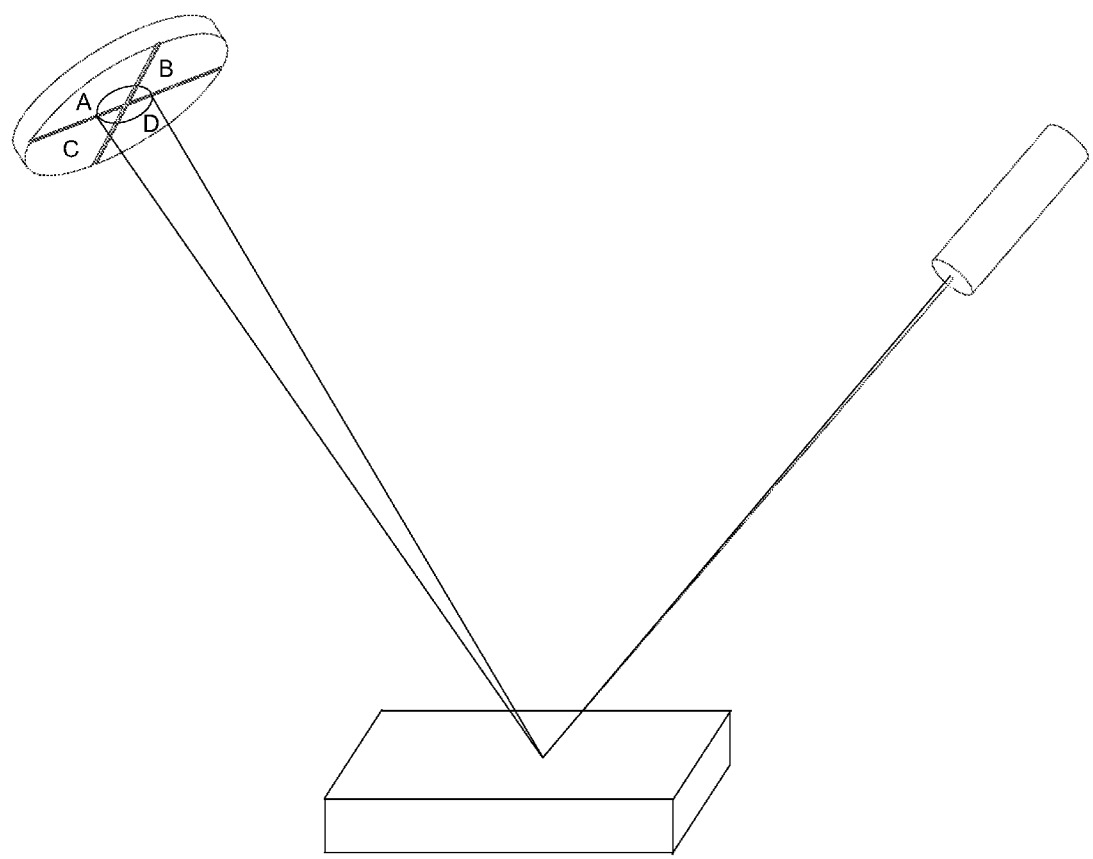
FIG. 6a is a schematic view of laser which is reflected from a mirror onto optical position sensor. The sensor is a split-diode photodetector which generates four currents from A, B, C, and D respectively.
Figure 6B:
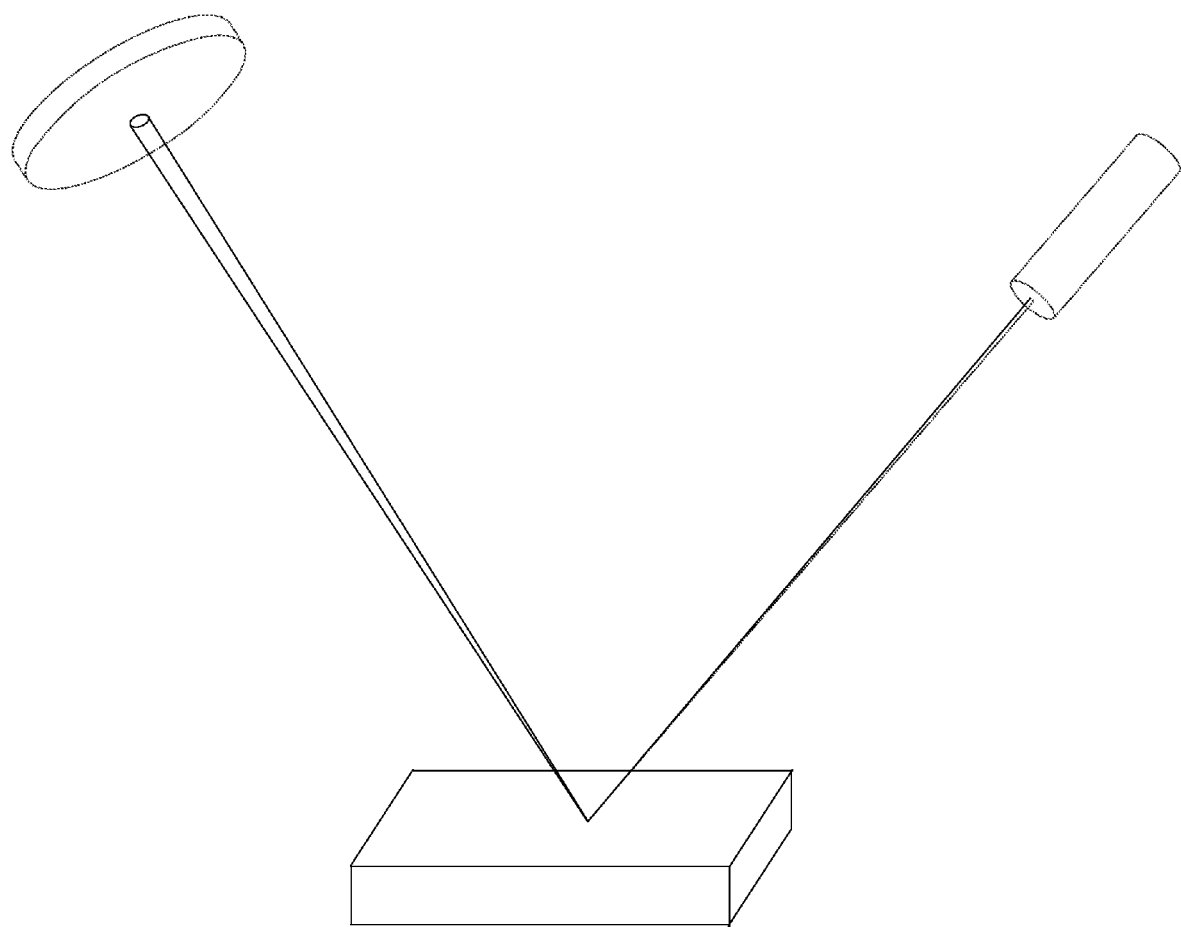
FIG. 6b is a schematic view of laser reflection from an optical position sensor. The sensor detects the position of laser on its multi-grid sensing cells.

According to another aspect of the present invention, above mentioned position errors can be calculated from optical position sensors. FIG. 6a is a schematic diagram of optical position sensor. A laser beam is reflected by a mirror, the reflected beam is directed to an optical position sensor. The optical position sensor is segmented into four separate active areas, hence it is also called four quadrant photodiode. There are well defined gap between the adjacent elements (A, B, C, and D in FIG. 6a) resulting in high response uniformity between the elements. For an optical position sensor 17 in the first laser positioning unit in FIG. 1a (like the optical position sensor in FIG. 6a), the differential signal from the top and bottom photodiodes ((A+B)−(C+D), FIG. 6a) provides the signal which is a sensitive measure of the platform vertical deflection ($\theta_x$), and the signal from the left and right ((A+C)−(B+D)) photodiodes provides the signal which is a sensitive measure of the platform horizontal deflection ($\theta_z$). Similarly, for the optical position sensor 27 in the second laser positioning unit in FIG. 1a (like an optical position sensor in FIG. 6a), the differential signal from the top and bottom photodiodes ((A+B)−(C+D)) provides the signal which is a sensitive measure of the platform vertical deflection ($\theta_y$), and the signal from the left and right ((A+C)−(B+D)) photodiodes provides the signal which is a sensitive measure of the platform horizontal deflection ($\theta_z$). The measured deflections ($\theta_x$, $\theta_y$, and $\theta_z$) and other moving errors (Δx, Δy, Δz) can be feed to the tilt stage 5 (FIG. 1a, FIG. 6a) to adjust the platform 6 so that the moving errors (Δx, Δy, Δz, $\theta_x$, $\theta_y$, and $\theta_z$) of stage can be counteracted. Alternatively, as shown in FIG. 6b, the optical position sensor can also be a non-split photo optical position sensor that the position of laser can be detected according to the beam position in the optical position sensor which composed of multi-grid sensing cells, and the physical position of laser spot on the optical position sensor can be used to calculate the deflections ($\theta_x$, $\theta_y$, and $\theta_z$) and moving errors (Δx, Δy, Δz) of platform 6.

According to another aspect of the present invention, above mentioned position errors can be calculated from four laser positioning units. As shown in FIGS. 1a, 1b, and 1c, the measurement of physical positions of mirrors 16 and 36 can be used to calculate directly the deflection $\theta_y$ and moving error Δx. Similarly, the measurement of physical positions of mirrors 26 and 46 can be used to calculate directly the deflection $\theta_x$ and moving error Δy. Hence the moving errors from tilting of the stage can be corrected.

With above disclosed method and apparatus, an XY stage can be positioned at very high precision with large range, so it can be applied in machine tool alignment, position measuring, beam centering, targeting, and guidance systems. It can also used in metrology for surface profiling in three dimensions.

Figure 7A:
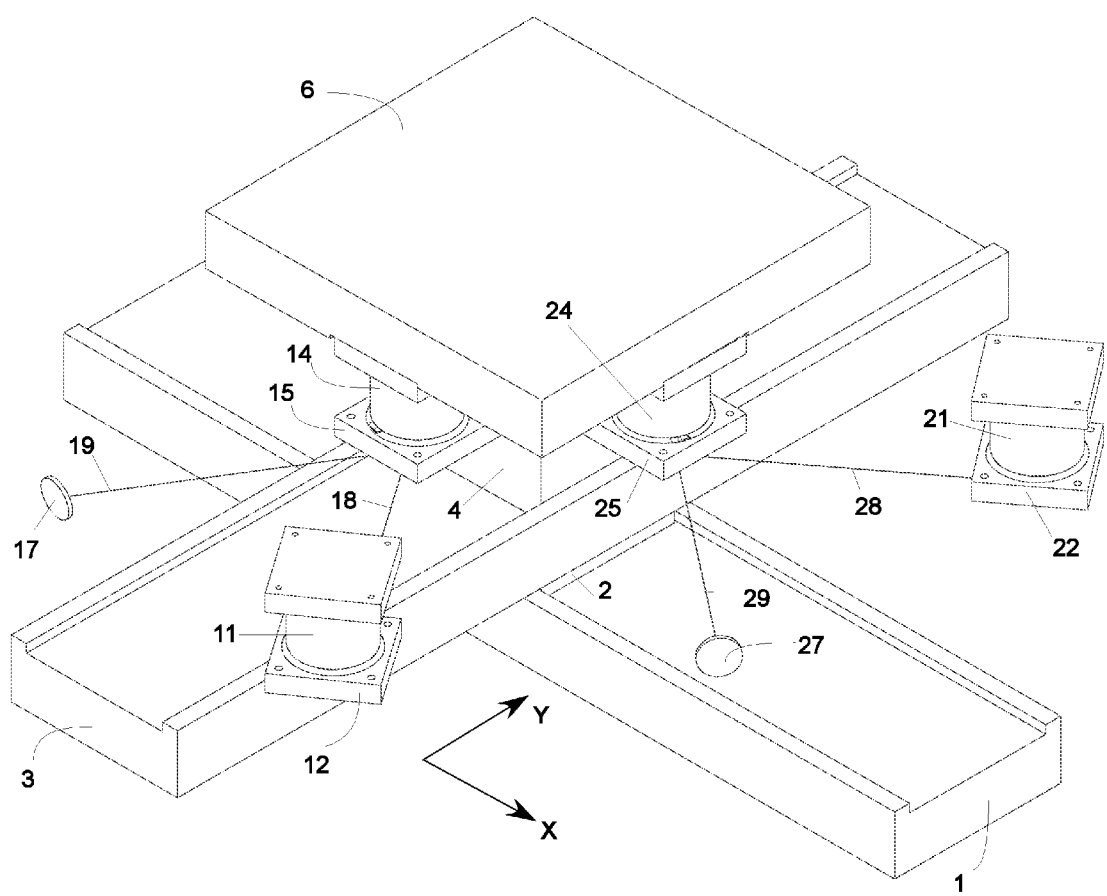
FIG. 7a is a schematic perspective view of XY stage with one laser positioning unit in X-direction and one laser positioning unit in Y-direction.
Figure 7B:
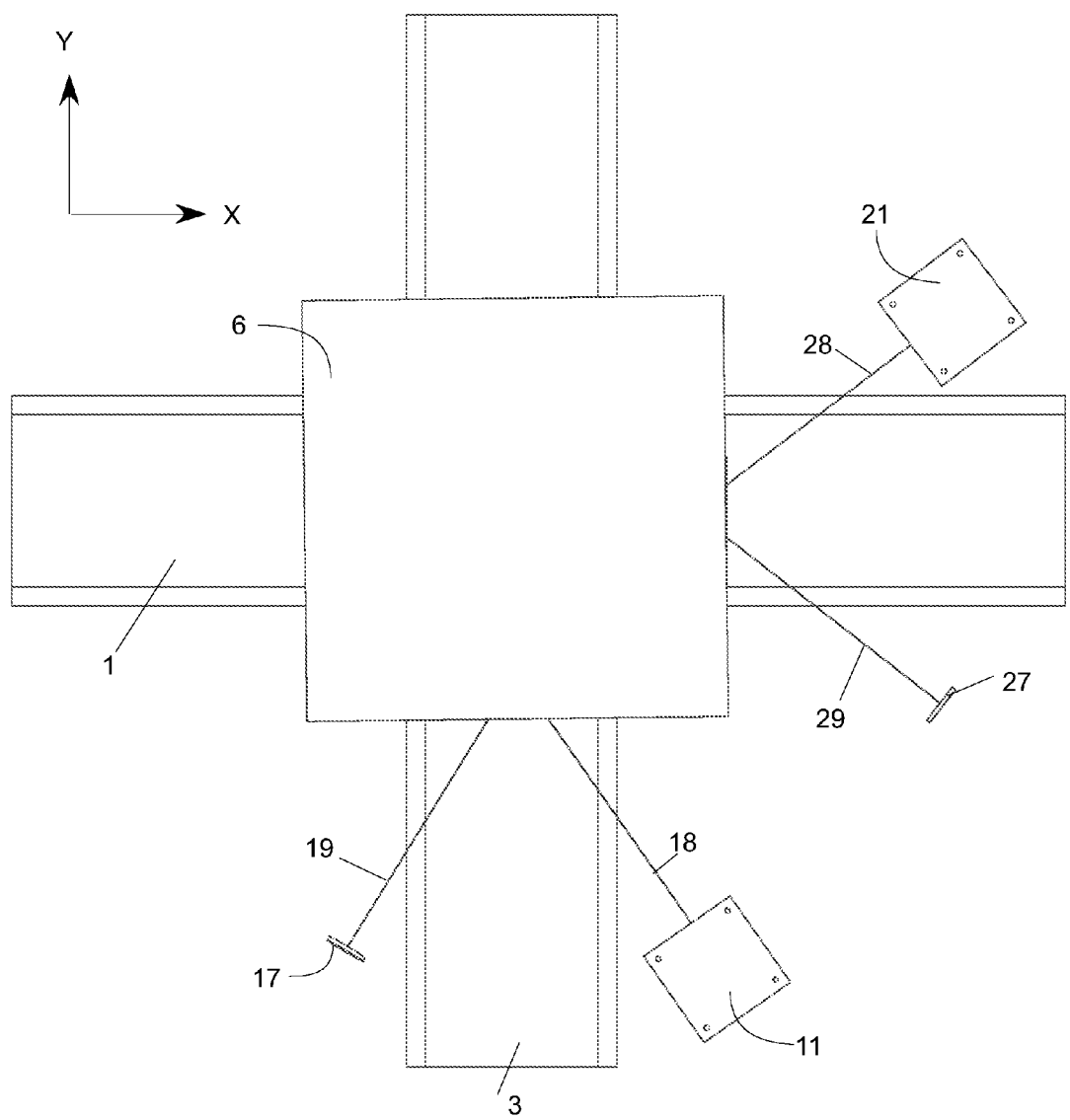
FIG. 7b is a schematic top view of XY stage with one laser positioning unit in X-direction and one laser positioning unit in Y-direction.
Figure 7C:
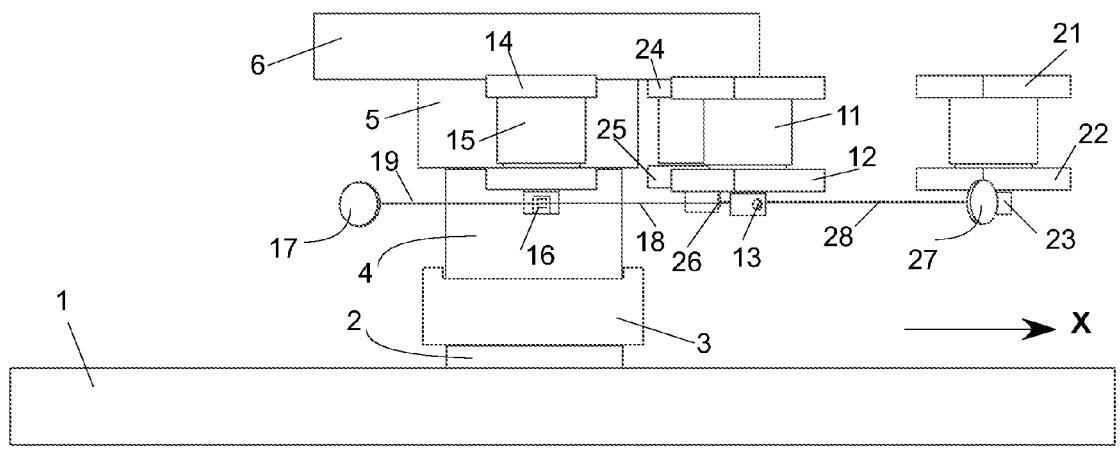
FIG. 7c is a schematic front view of XY stage with one laser positioning unit in X-direction and one laser positioning unit in Y-direction.

As a further embodiment, for some applications such as 3D surface profiling in metrology, the stage can be temporarily stopped in a very short time. In this case, for controlling and positioning an XY stage, in stead of using 4 laser positioning units (FIG. 1a), only 2 laser positioning units can position the stage. As schematically shown in FIGS. 7a, 7b, and 7c, if fine rotation stage 12 or/and 15 reach their full range which limiting them from further rotation, we can stop platform 6 temporarily, in other words, platform 6 is not moving in a short term, if we can rotate the fine rotation stages 12 and 15 back to their starting position, and meantime move the coarse rotators 11 and 14 to guarantee that the laser beam is detected by the optical position sensor 17 with minor adjustment of fine rotation stages 12 and 15. After the fine rotation stages 12 and 15 back to or near to the starting positions, the stage can move again and the moving position can be positioned by the fine rotation stages 12 and 15. In this case, only one laser positioning unit is needed for positioning movement in x-axis direction. Similarly, another laser positioning unit can be used position the stage moving in y-axis direction.

Figure 2A:
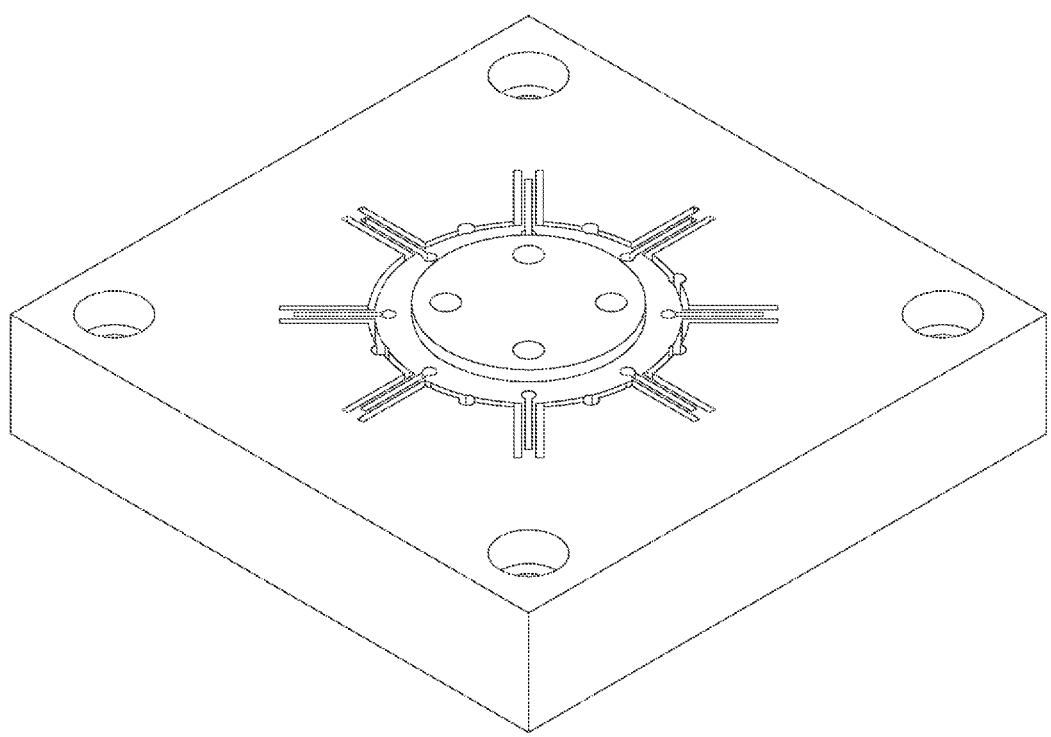
FIG. 2a is perspective view of schematic diagram of fine rotation stage, symmetrical spring hinges are distributed around the center, piezoelectric stacks (not shown) is used to drive the spring hinges with very high resolution and without friction.
Figure 2B:
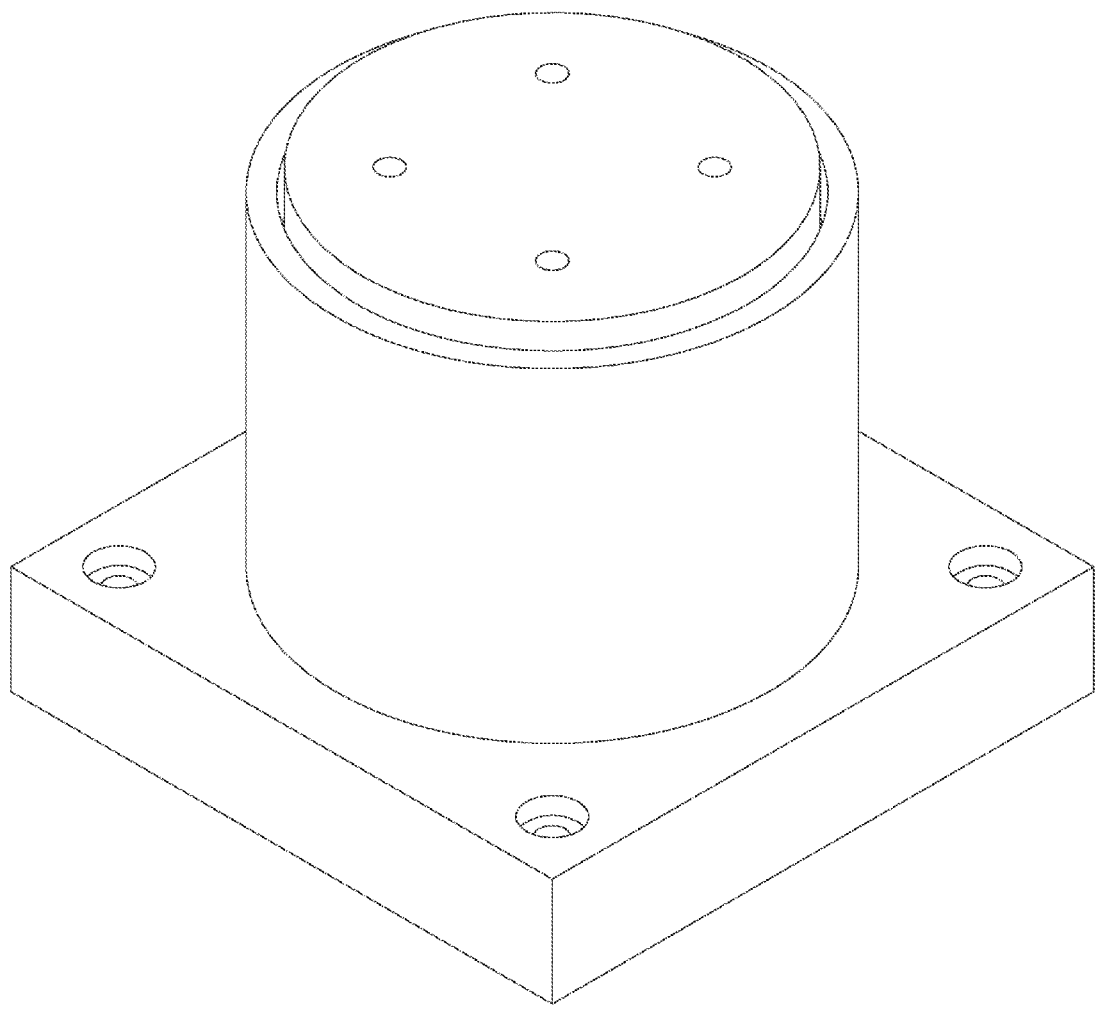
FIG. 2b is perspective view of schematic diagram of coarse rotation stage; a precision motor (stepper motor or servo motor, not shown) is used to drive the rotation stage which has large range in rotation.
Figure 8A:
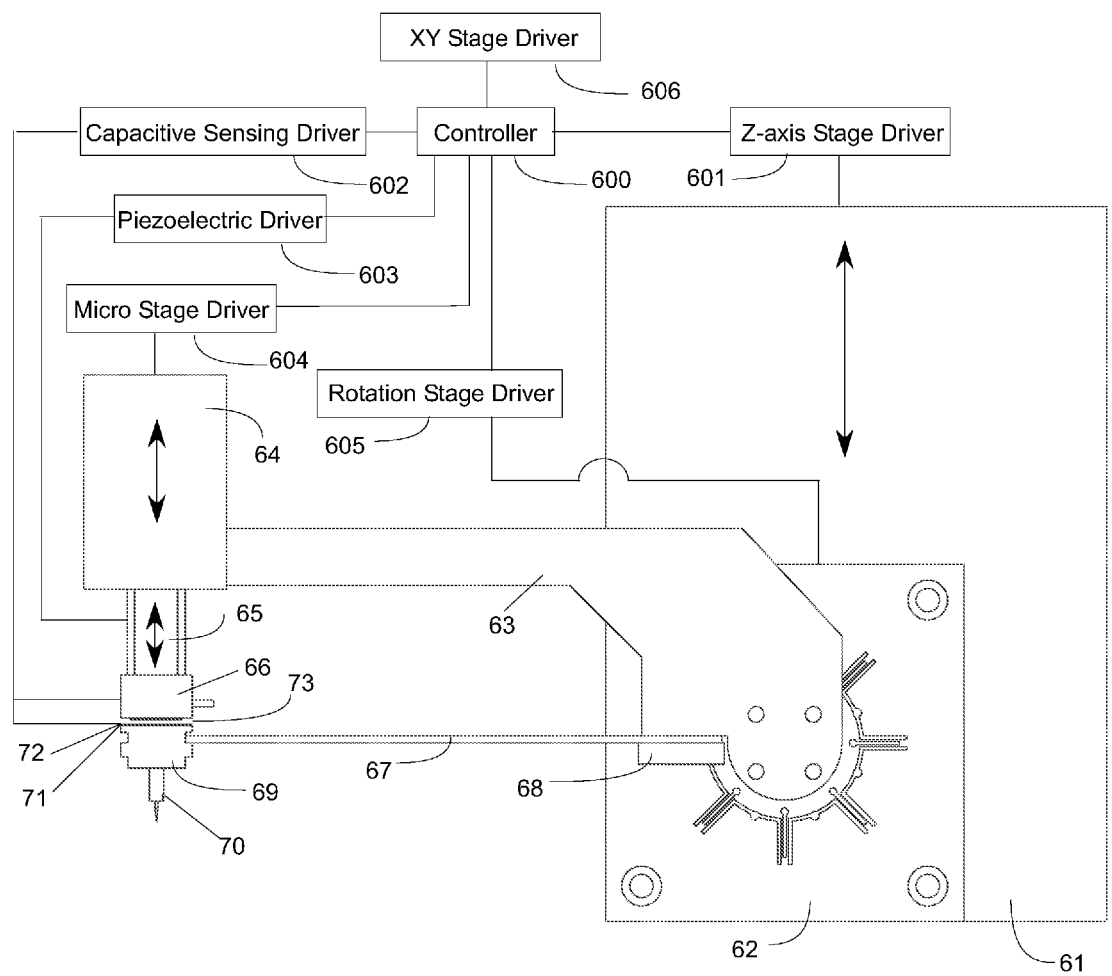
FIG. 8a is a front view of surface sensing device, control system is shown.
Figure 8B:
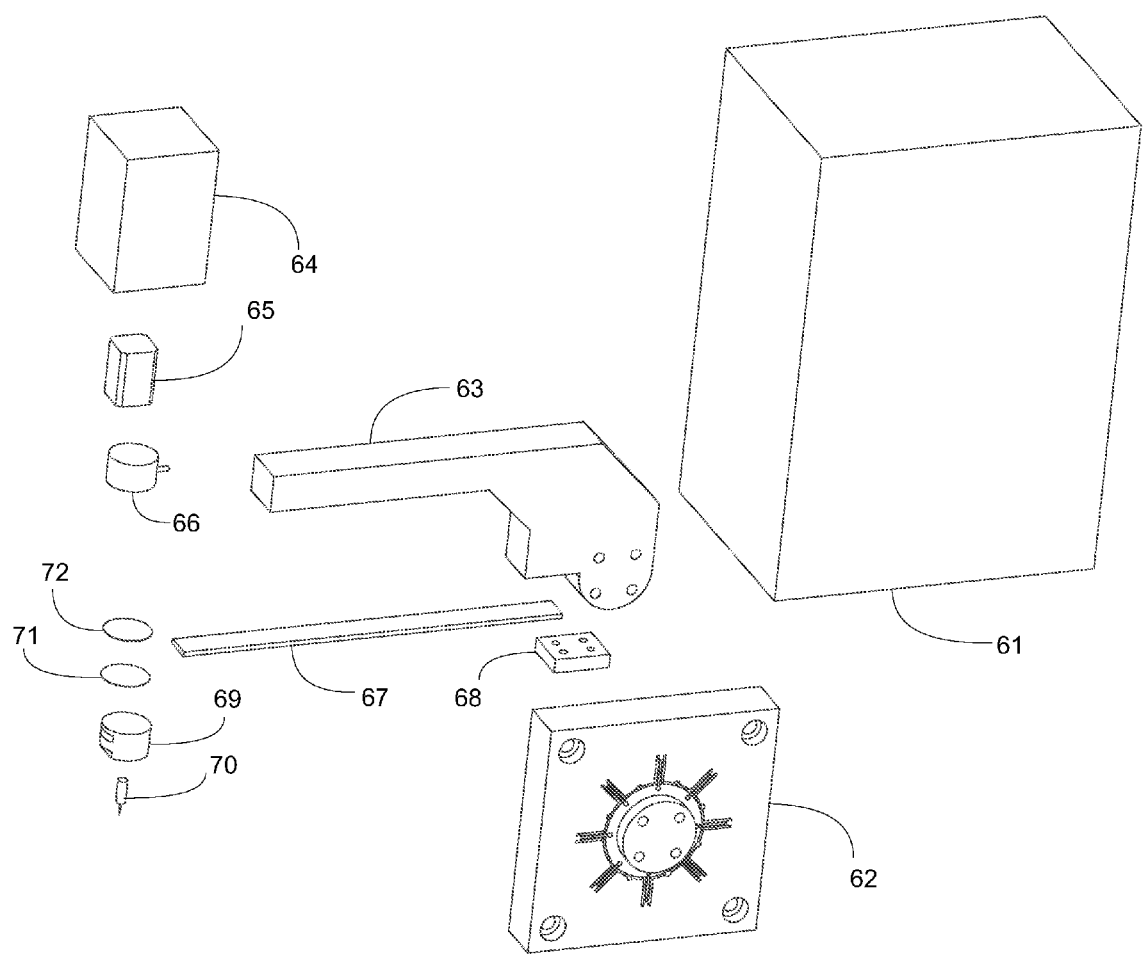
FIG. 8b is an exploded perspective view of surface sensing device, control system is not shown.

As schematically illustrated in FIG. 8a as a front view and in FIG. 8b as exploded perspective view, z-axis stage 61 rigidly holds a frictionless rotation stage 62 which is similar to that shown schematically in FIG. 2a. The rotation stage 62 rigidly holds a holder 63 which holds a micro stage 64, the micro stage 64 can move vertically and it holds piezoelectric stacks 65, the piezoelectric stacks 65 holds a capacitive sensor 66. One end of a spring cantilever 67 is rigidly attached under the holder 63 by a tightening plate 68, and an open end of the spring cantilever 67 is tightly coupled to a cantilever holder 69, a tip holder 70 is detachably mounted on the cantilever holder 69, a capacitive film sensor 72 and an insulator film 71 is physically deposited on the top of cantilever holder 69. There is an empty gap 73 between capacitive sensor 66 and capacitive film sensor 72 which are placed in parallel.

Before operation, the micro stage 64 and piezoelectric stacks 65 are controlled to move the capacitive sensor 66 and to keep a preset gap 73 by controller 600, micro stage driver 604 and piezoelectric driver 603. Then the z-axis stage 61 moves all the components numbered by from 61 to 72 downwardly until the stylus tip in tip holder 70 is near the surface of sample (not shown). Diamond tip is preferably used as stylus tip in this case. During operation, the piezoelectric stacks (not shown in FIG. 2a) in rotation stage 62 is controlled to drive the stage to rotate with high precision, and the rotation stage 62 rotates precisely in such way so that the stylus tip in tip holder 70 is raised or lowered to touch the surface of sample with controlled contact force, in this case, the spring cantilever 67 will bend and capacitance between capacitive sensor 66 and film capacitive sensor 72 will change. At this moment, rotation of the rotation stage 62 can be used to calculate precisely the height of touched surface. An unshown XY stage (for 3D imaging or an X stage for 2D imaging) is controlled by XY stage driver 606 to move the sample (not shown). The location of the feature can then be determined by recording the XY positions of the points at which the sensing tip was lowered until the preset deflection of spring cantilever is detected by the capacitance between capacitive sensor 66 and film capacitive sensor 72. Therefore the rotation stage 62 precisely measures the surface height, and the gap 73 is related to the contact force between the stylus tip in tip holder 70 and the sample (not shown).

After sensing the selected area by repeating above procedures, a two or three dimension profile of a surface can be mapped by a computer. The gap 73 can be pre-adjusted by the micro stage 64 and piezoelectric stacks 65, so the contact force of stylus tip to sample surface can be controlled during surface scanning.

According to the provisions of the patent statues, we have explained the principle, preferred construction of the invention and have illustrated and described what we now consider to represent its best embodiments. However, it should be understood that within the scope of the claims and the foregoing description, the invention may be practiced otherwise than specifically illustrated and described.

What is claimed is:

1. Control method for positioning a stage using a plurality of two pairs of laser positioning units, comprising steps of:

Running each said laser positioning unit which composed of a laser beam, a mirror, and an optical position sensor;

Projecting said laser beam from a laser diode onto said mirror by rotating first fine rotation stage which holds said laser diode;

Reflecting said laser beam from said mirror onto a stationary optical position sensor by rotating second fine rotation stage which holds said mirror;

Detecting position of said laser beam on said optical position sensor which is rigidly mounted on a stationary base;

Positioning said stage with at least two said laser positioning units in each moving direction;

Before operation, setting said first fine rotation stage and said second fine rotation stage in said first pair of laser positioning unit to starting position of full range or any other position, and set said first fine rotation stage and said second fine rotation stage in said second pair of laser positioning unit to middle position of full range or an other position that different from said position in said first pair of laser positioning unit;

Before operation, adjusting said first fine rotation stage and said second fine rotation stage in said a plurality of two pairs of laser positioning units, and adjusting first coarse rotation stage which holds said first fine stage and second coarse rotation stage which hold said second fine stage in said a plurality of two pairs of laser positioning units, so that said laser beam is reflected from said mirror onto said optical position sensor;

During operation, when said stage moves, rotating said first fine rotation stages and said second fine stages in said a plurality of pair of laser positioning units, so that said laser can be continuously reflected by said mirror onto said photodiodes sensor;

During operation, returning said first fine rotation stage and said second fine rotation stage in said second pair of laser positioning unit to starting position or any other position if said first fine rotation stage and said second fine rotation stage in said second pair of laser positioning unit reaches moving limit, by rotating said first coarse rotation stage which holds said first fine rotation stage in said second pair of laser positioning unit, and by rotating said second coarse rotation stage which holds said second fine rotation stage in said second pair of laser positioning unit, by constantly keeping laser beam projected on said photodiodes sensor;

During operation, returning said first fine rotation stage or said second fine rotation stage in said first pair of laser positioning unit to starting position or any other position if said first fine rotation stage or said second fine rotation stage in said first pair of laser positioning unit reaches moving limit, by rotating said first coarse rotation stage which holds said first fine rotation stage in said first pair of laser positioning unit, or by rotating said second coarse rotation stage which holds said second fine rotation stage in said first pair of laser positioning unit b constantly keeping laser beam projected on said photodiodes sensor;

Re-calibrating positions of said first fine rotation stage and said second fine rotation stage in said plurality of pair of laser positioning units if said first coarse rotation stage or said second coarse rotation stage rotates at a time in said plurality of pair of laser positioning units, by the positions of said first fine rotation stage or said second fine rotation stage in other said a plurality of pair of laser positioning units when said first coarse rotation stage or said second coarse rotation stage does not move at said time;

Calculating positions of said stage which holds said mirror, based on the amounts of rotations of said first fine rotation stage and said second fine rotation stage in each pair of said laser positioning unit, based on the position of laser beam on said optical position sensor, and based on geometry of triangle among physical positions of said mirror, said laser diode, and said optical position sensor;

Controlling and positioning said stage based on the position of said mirror which sits on said stage firmly;

Calculating position of said stage by computer programming;

Controlling rotation of said fine stage and said coarse stage by computer programming;

Controlling a tilting stage in order to correct the moving deflections and errors for said platform; and Repeating above operations by running a plurality of said laser positioning units simultaneously.

* * * * *